(12) United States Patent
Onose et al.

(10) Patent No.: US 6,566,726 B1
(45) Date of Patent: May 20, 2003

(54) SEMICONDUCTOR DEVICE AND POWER CONVERTER USING THE SAME

(75) Inventors: Hidekatsu Onose, Hitachi (JP); Tsutomu Yatsuo, Hitachi (JP); Toshiyuki Ohno, Hitachi (JP); Saburou Oikawa, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/516,501

(22) Filed: Mar. 1, 2000

(30) Foreign Application Priority Data

Mar. 2, 1999 (JP) .............................. 11-053605

(51) Int. Cl.[7] .............................................. H01L 29/40
(52) U.S. Cl. ...................... 257/490; 257/488; 257/492
(58) Field of Search ................................. 257/490, 492, 257/488

(56) References Cited

U.S. PATENT DOCUMENTS 4,667,393 A * 5/1987 Ferla et al. ................ 257/592

* cited by examiner

*Primary Examiner*—Jerome Jackson
(74) *Attorney, Agent, or Firm*—Antonelli, Terry, Stout, & Kraus, LLP

(57) ABSTRACT

To reduce the field intensity on the termination surface, almost not affecting the on-characteristic, a drift layer is made of two layers, an n-layer and $n^-$ layer, and a termination region is formed on the surface of the above $n^-$ layer. An impurity concentration ratio between the $n^-$ layer and the n-layer is less than 1:2, and the thickness of the $n^-$ layer is less than that of a source $n^+$ layer. Reliability can be secured even in a high temperature operation.

10 Claims, 6 Drawing Sheets

SEMICONDUCTOR DEVICE AND POWER CONVERTER USING THE SAME

BACKGROUND OF THE INVENTION

The present invention relates to a termination construction of a semiconductor device.

As a method for realizing a high performance power semiconductor element, attempts have been made to make a drift layer which is higher in concentration and thinner than Si by using silicon carbide (hereunder, referred to as SiC) which has a large electron avalanche breakdown electric field, to lower the electric resistance and to reduce power loss occurring under the conducting-state and at the time of switching.

In a planar type semiconductor element, such as a power MOSFET, which emits lines of electric force under a non-conducting-state, not from not an end, but from a surface, a termination region is formed on a surface of a drift layer of low impurity concentration. The electric intensity on the surface, in the case of an n-type power MOSFET, becomes maximum at a boundary between a p-base formed at the outer most side of an active region and an n-drift layer in a termination region, decreases toward a peripheral portion of the element in the termination region, and at the same time, also decreases toward the inside of the p-base.

On the surfaces of the termination and p-base in contact therewith, in general, a passivation layer film is formed of an oxide material. In the oxide film, when the field intensity exceeds several MeV/cm, the frequency of dielectric breakdown increases. At a high temperature, even when the field intensity is 2 MeV/cm or less, the probability of occurrence of dielectric breakdown is larger than 1%, and so it becomes impossible to ignore it. On the other hand, the field intensity of SiC to the dielectric breakdown thereof is 2.2 MeV/cm, and the impurity concentration of a drift layer is designed so that the electric intensity at the boundary between a p-well inside the element and a n-drift layer exceeds the value. It is the same even at a junction interface between the above-mentioned termination and the p-well, and so a ratio of occurrence of breakdown can not be ignored. Therefore, as disclosed in "International Conference of Silicon Carbide, III-Nitrides and Related Materials 1997, page 136", as a termination structure, attempts have been made to employ a structure called JTE (Junction Termination Extension). FIG. 2 is a typical sectional view a JTE, in an example of a $P^+/n$ diode. In FIG. 2, 11 denotes a high concentration $n^+$ substrate, 12 denotes a low concentration (high resistance) $n^-$ epitaxial layer, 31 denotes a cathode electrode, 32 denotes an anode electrode, 21 denotes a $P^+$ layer and an anode region in the diode. The concentration of the $n^-$ layer is selected a maximum value at which a prescribed breakdown voltage is obtained. The present example is characterized in that band-like p-type regions 22 and 23 successively reduced in concentration are formed adjacent to and on the outside of the anode $p^+$ 21. On the surface, the highest field intensity is at a junction interface between the p-type region 23 and a n-termination region. An attempt is made to make the extension of a depletion layer into a p-type region large by lowering the concentration of the p-type region in contact with the junction interface, reducing the field intensity on the surface and reducing the percentage of occurrence of the dielectric breakdown.

SUMMARY OF THE INVENTION

In order to reduce the field intensity at a $P^+/n$ junction to a great extent, it is sufficient to lower the concentration of the p-layer to about the same degree as the concentration of the n-layer. However, considering variation in manufacturing, a lower limit of the concentration of the p-region 23 is about twice as high as the concentration of the n-layer. A field intensity reduction effect obtained by reducing the concentration of the p-type region to this degree, in the case where the expansion of the depletion layer at the $P^+/n$ junction is simulated to be only an n-side, is $(\frac{2}{3})^{1/2}$ at most by Poisson's equation, and is reduced only to 80%. That is, there is a field intensity of about 1.6 MeV/cm. The electric field is reduced because an effect of releasing an electric field onto the surface is added to the effect, however, it is difficult to reduce the electric field to lower than 1 MeV/cm, at which the frequency of dielectric breakdown can be ignored.

An object of the present invention is to provide a structure in which the field intensity on a termination surface can be effectively reduced to about 1 MeV/cm or less and, desirably, to about an interface of $Si/SiO_2$ in order to cause dielectric breakdown even at a high temperature, even if a semiconductor such as SiC which is larger in electron avalanche breakdown field than Si is used.

A second object of the present invention is to provide a structure which is able to reduce the electric intensity, almost not affecting an on-characteristic.

In order to solve the above problem, in accordance with the present invention, in a $P^+/n$ diode and a n-channel transistor, a drift layer is made into two layers comprising an $n^-$ layer of lower concentration and higher resistance in addition to a conventional n-layer, and a termination region is formed on the surface of the $n^-$ layer.

In accordance with the present invention, an impurity concentration ratio of the $n^-$ layer and the n-layer is less than 1:2. Alternatively, a resistance ratio of the $n^-$ layer and the n-layer is 2:1 or larger.

Further, in order to achieve the second object, in accordance with the present invention, the thickness of the $n^-$ layer is made thinner to be less than that of the n-layer. Further, in accordance with the present invention, a structure is adopted in which there is no above-mentioned $n^-$ layer in the drift region or channel region. For example, in a diode, the $n^-$ layer O is made shallower than a high concentration p-layer. In a transistor, the $n^-$ layer is made thinner than the thickness of a source $n^+$ layer, and further, the $n^-$ layer is made shallower than a p-type region in contact with the termination region, and the $n^-$ layer is provided only in the termination region.

Since the $n^-$ layer of lower concentration than the n-layer is provided on the surface side, the width of a depletion layer of an n-side on the surface becomes long, and so it is possible to suppress the field intensity of the surface to less than 1 MeV/cm even if the maximum field intensity inside the element is 2 MeV/cm.

Further, by making the impurity concentration ratio between the $n^-$ layer and the n-layer less than 1:2, and by extending the width of the depletion layer on the n-side to be twice or more, the field intensity of the surface can be reduced to less than 1 MeV/cm, further to about the same degree as the interface of $Si/SiO_2$. The above-mentioned impurity concentration ratio corresponding to that of the resistance ratio is larger than 2:1 on the contrary.

On the other hand, since the $n^-$ layer is larger in resistance than the n-layer, the $n^-$ layer in the drift region or channel region increases in on-resistance, which invites a worsening of the characteristics. In accordance with the present invention, by making the $n^-$ layer thinner than the n-layer, it is possible to prevent the characteristics from being degraded. Further, in a transistor, by making the n⁻ layer thinner than the source n⁺ and shallower than the p-type region contacting the termination, and, in a diode, by making it shallower than the high concentration p⁺ layer, a structure in which the n⁻ layer does not substantially exist in the channel or drift region results, and it is possible to nullify any degradation of the characteristics.

Further, even if each semiconducting layer is reversed in conductive type, that is, even if a p-type is replaced by a n-type layer and a n-type layer is replaced by a p-type layer, the same operation and effect are achieved.

EMBODIMENT OF THE INVENTION

Embodiments of the present invention will be explained hereunder in detail.

Figure 1:
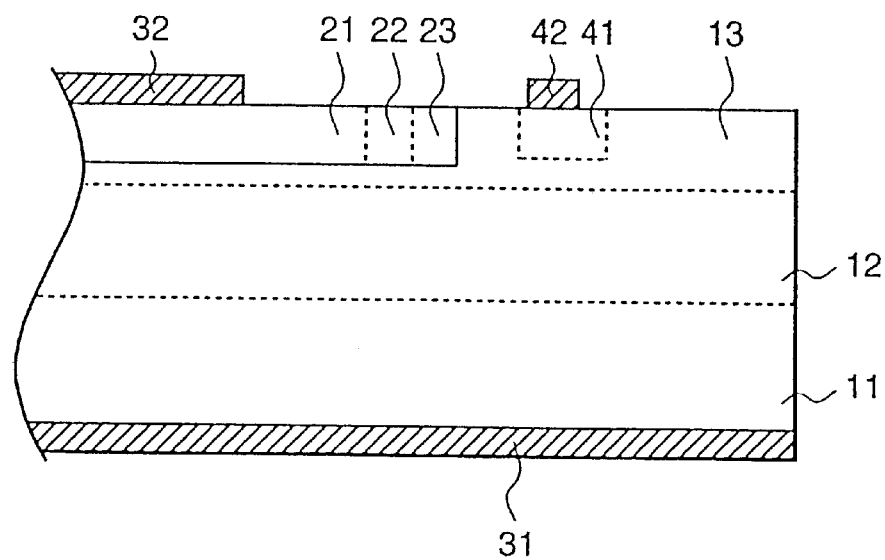
FIG. 1 is a sectional view of a termination structure of a first embodiment of the present invention.
Figure 2:
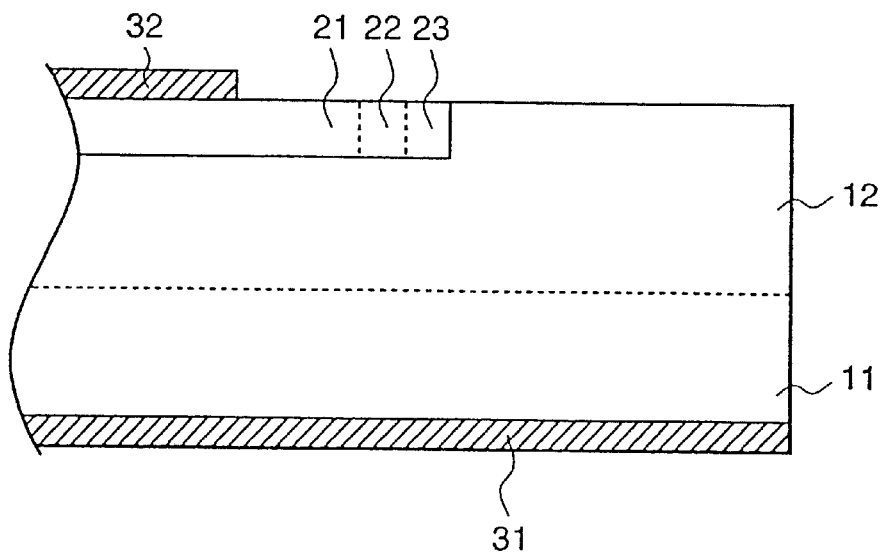
FIG. 2 is a sectional view of a conventional termination structure.

FIG. 1 is a sectional view of an end structure representing a SiC p⁺/n diode of an embodiment of the present invention. In FIG. 1, 11 denotes a high concentration n⁺ substrate which is a cathode region, 12 denotes an n-type epitaxial layer, 13 denotes a low concentration n⁻ layer epitaxially grown from the n-type epitaxial layer, 21 denotes p⁺ region which is an anode region, 22 and 23 denote p-type JTE regions in which the concentration becomes successively lower, 41 denotes an n⁺-channel stopper, 32 denotes an anode electrode, 31 denotes a cathode electrode and 42 denotes a field plate.

In the present embodiment, the concentration (ND) of a n-type epitaxial layer 12 has a value at which a prescribed breakdown voltage can be obtained. In the present embodiment, $ND=2\times10^{15}/cm^3$. Further, the thickness of the epitaxial layer 12 is 50 μm. The electric field relaxation n⁻ layer 13 is formed through epitaxial growth, the concentration is $1\times10^{15}/cm^3$ and the thickness is 1.5 μm. The p-type regions 21, 22, 23 are formed by an ion implanting method, the depth of the junction is 1.2 μm and it is a shallower structure than the n⁻ layer 13.

Since the concentration of the surface of the n-side region in the termination is ½ times as high as the concentration at which a prescribed breakdown voltage can be obtained, the depletion layer becomes twice and it is possible to make the field intensity of the junction to be ½ whereby dielectric breakdown does not occur even at a high temperature.

The present embodiment was explained with reference to a p⁺/n diode (PND) as an example, however, the present invention is not limited thereto, and the same effect is attained even in a Schottky barrier diode (SBD), in which region 21 is provided as a guard ring, an anode electrode 32 Schottky-junctions at n⁻ layer 13 in a region not shown, and an electrostatic induction type diode (SID) which is a compound element of PND and SBD arranging band-like p⁺ of about several μm in the Schottky junction region.

Figure 3:
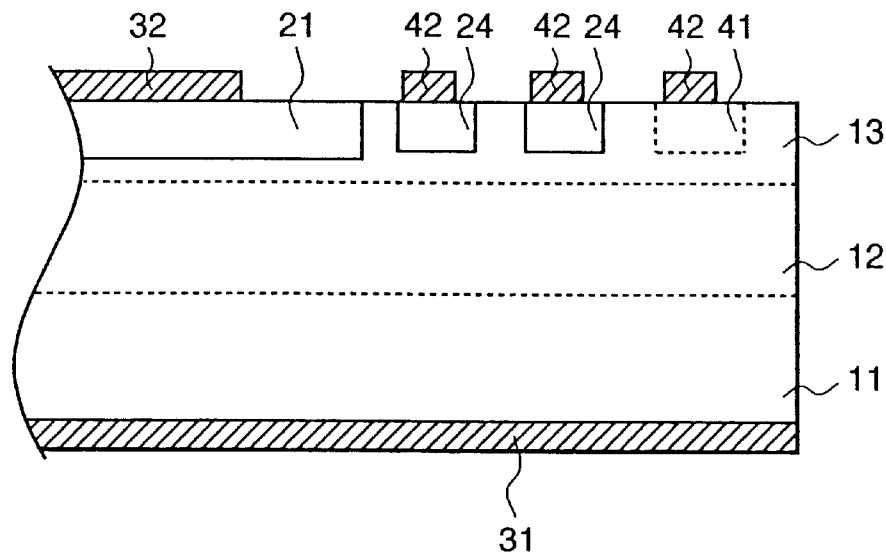
FIG. 3 is a sectional view of a termination structure of a second embodiment of the present invention.

FIG. 3 is a sectional view of an end structure of a SiC PND representing a second embodiment of the present invention. The embodiment is a case of providing a combination with a FLR (Field Limiting Ring). In FIG. 3, reference numeral 21 denotes a region common to an anode p⁺ and a guard ring. Reference numeral 24 denotes a ring-shaped p-type FLR, which has a shallower structure than the n⁻ layer 13. In the present embodiment, two FLR are arranged between a channel stopper 41 and the region 21. A field plate 42 is formed in each FLR.

In the same manner as in the first embodiment, by making the concentration of the n⁻ layer 13 ½ times the concentration of the n-type epitaxial layer 12, an effect of the depletion layer extension of FLR expands, the electric field at a surface junction with the p⁺ region 21 is greatly relaxed, and it is possible to obtain a prescribed breakdown voltage even at a high temperature.

As in the first embodiment, the present invention also provides a SBD and SID with the same effect as that obtained in the PND.

Figure 4:
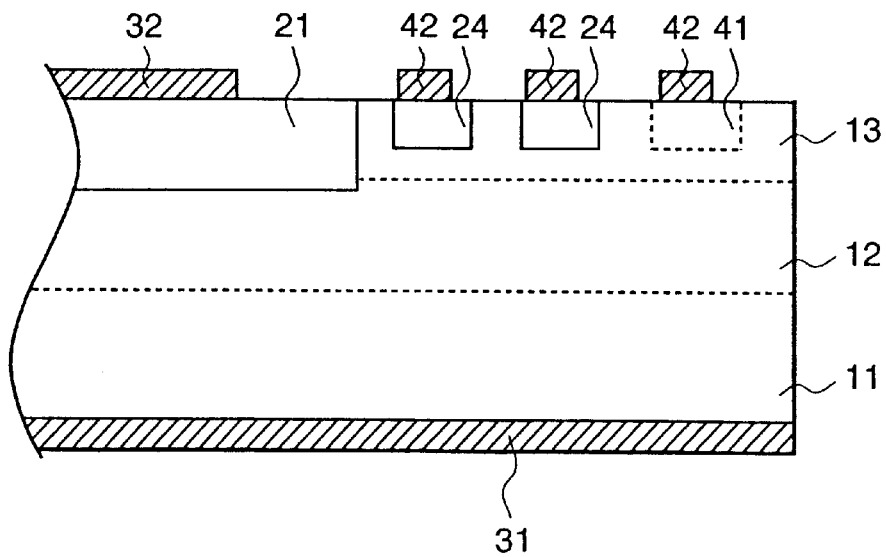
FIG. 4 is a sectional view of a termination structure of a third embodiment of the present invention.

FIG. 4 is a sectional view of an end structure of a SiC PND using FLR in the termination structure representing a third embodiment of the present invention. A difference between the present embodiment and the second embodiment is that the combined guard ring and p⁺ region 21 is formed to be shallower than the n⁻ layer. Thereby, since there is no n⁻ layer 13 having a high resistance in a region under the p⁺ region 21, which is a drift region, there is an advantage in that there is no bad influence to the on-characteristic. On the other hand, in the same manner as in the second embodiment, by providing the n⁻ layer 13 in the termination region, the effect of the depletion layer extension of FLR expands, the electric field at a surface junction with the p⁺ region 21 is greatly relaxed, and it is possible to obtain a prescribed breakdown voltage even at a high temperature. That is, without affecting the on-characteristic, it is possible to relax the field intensity, and a prescribed breakdown voltage can be achieved even at a high temperature.

Formation of the n⁻ layer 13 through epitaxial growth forms an n⁻ 13 of high resistance layer also inside the guard ring 21 in the SBD or SID. In order to prevent prevention of the high resistance layer, an n⁻ layer is formed in the SBD or SID by selectively ion-implanting p-type impurities of lower concentration than the n-type epitaxial layer 12 in the termination region of the n-type epitaxial layer 12 and lowering the net n-type impurity concentration of the ion-implanted region. By this method, since a high resistance layer is not formed inside the guard ring 21, a prescribed breakdown voltage can be achieved without affecting the on-characteristic, as in the PND.

The above-mentioned first to third embodiments each were explained with reference to the case of a diode in which the drift layer is n-type, however, the present invention is not limited thereto, but is applicable to the case of a diode in which the drift layer is p-type.

Figure 5:
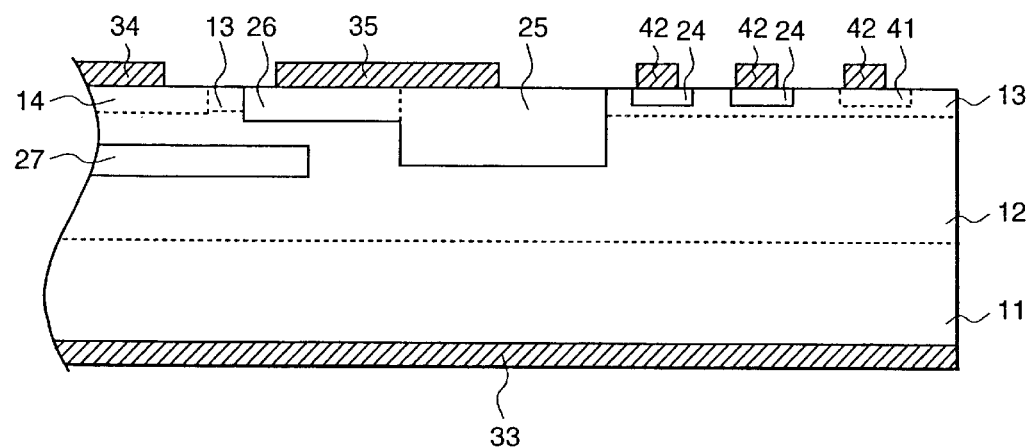
FIG. 5 is a sectional view of a structure of a buried type junction FET of a fourth embodiment of the present invention.

FIG. 5 is a sectional view of a depletion layer type conjunction FET (Field Effect Transistor) representing a fourth embodiment of the present invention. In FIG. 5, 11 denotes a high concentration n⁺ substrate which becomes a drain region, 12 denotes an n-type epitaxial layer which becomes a drift layer, 13 denotes an n⁻ layer in which the concentration of impurities is ½ times the concentration of the n-type epitaxial layer 12, 14 denotes a source n⁺ region, 24 denotes a ring-shaped p⁺ FLR, 25 denotes a combined guard ring and gate p⁺ region, 26 denotes a gate p⁺ region on the surface side, 27 denotes a depletion layer gate p⁺ region, 33 denotes a drain electrode, 34 denotes a source electrode, 35 denotes a gate electrode, 41 denotes a ring-shaped n⁺ channel stopper and 42 denotes a field plate. The depletion layer gate p⁺ region 27 is indirect contact with the surface side gate p⁺ region 26 without the intervention of the n-epitaxial layer 12, and is formed so as not to electrically float.

A feature of the depletion layer type junction FET of the present embodiment is that the n⁻ layer 13 is made shallower than the source n⁺ region 14. A channel is formed between the depletion layer p⁺ region 27 and the source n⁺ region 14 and surface side gate p⁺ region 27, and becomes an electric passage under the current passage condition. In this embodiment, since the thickness of the n⁻ layer 13 is made shallower than the source n⁺ region 14, a high resistance region does not appear, and the eclectic intensity in the termination region can be relaxed by introducing the n⁻ layer, and a prescribed breakdown voltage can be achieved even at a high temperature, without relaxing the on-characteristic, as in the case of a diode.

Figure 6:
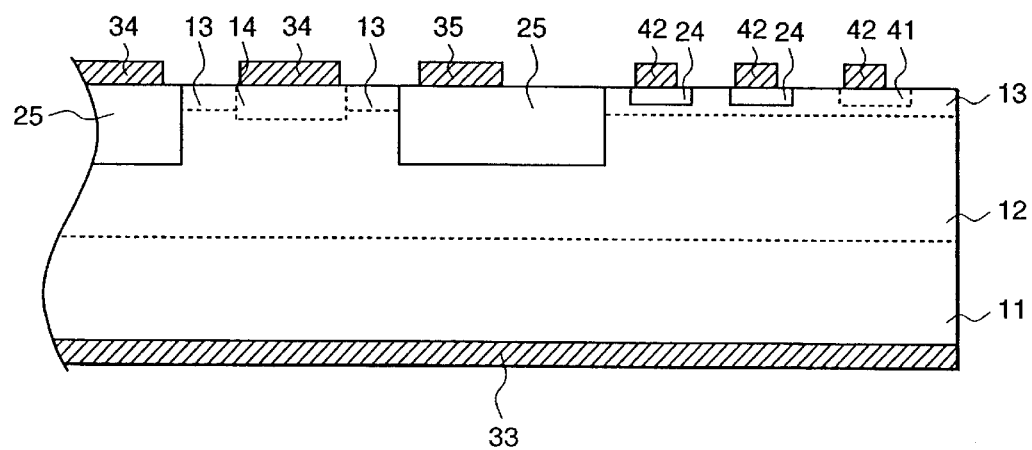
FIG. 6 is a sectional view of a structure of a planar type junction FET of a fifth embodiment of the present invention.

FIG. 6 is a sectional view showing a planar type junction FET representing a fifth embodiment of the present invention. In the FET of the present embodiment, a channel is formed between the gate p⁺ region 25, which becomes a guard ring on the termination side, and under the source p⁺ region 14. In the same manner as in the above fifth embodiment, since the n⁻ layer 13 of lower concentration than the n-type epitaxial layer 12 is made shallower than the source n⁺ region, a high resistance does not appear in the channel and a prescribed breakdown voltage can be achieved even at a high temperature without damaging the on-characteristic.

Further, in the present embodiment and fifth embodiment, the n⁻ layer 13 is formed by epitaxial growth, succeeding formation of the n-type epitaxial layer 12.

Figure 7:
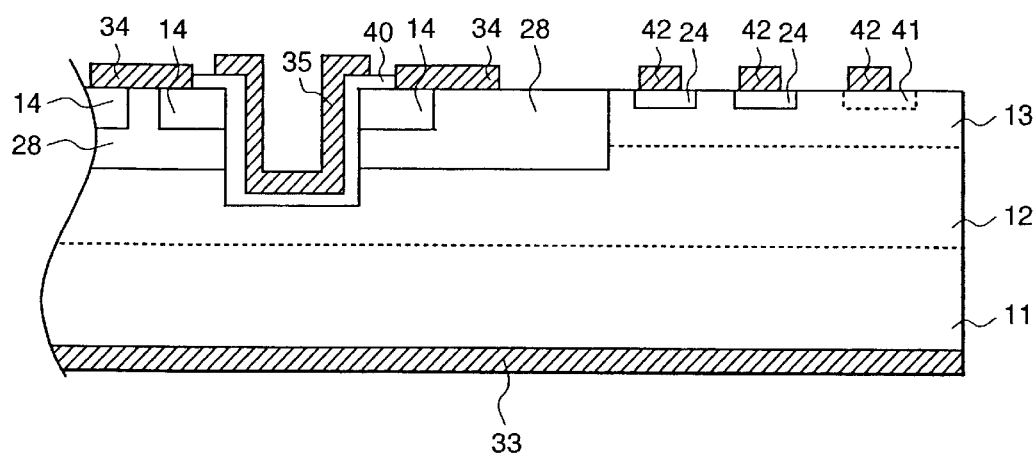
FIG. 7 is a sectional view of a structure of a trench type MOSFET of a sixth embodiment of the present invention.

FIG. 7 is a sectional view of a trench type MOSFET representing a sixth embodiment of the present invention. In FIG. 7, 28 denotes a combined guard ring and p-base region and 40 is a oxide film for forming a MOS interface.

A feature of the trench type MOSFET of the present embodiment is that the n⁻ layer 13 is made shallower than the p-base region 28. In the p-type region 28, a channel is formed in a trench side wall portion of the p⁺ region 28 by reversing a portion near the interface with the oxide film 40 into a n-type. Current flows from the source n⁺ region 14 to the n⁺ substrate 11, which is a drain region, through the trench side wall portion, which is a reverse layer of the p-type region 28 and the n-type epitaxial layer 12, which is a drift layer. In the present embodiment, since the thickness of the n⁻ layer 13 of lower concentration than the n-type epitaxial layer 12 is made shallower than the p⁺ region 28, a high resistance region does not appear in the drift layer and a prescribed breakdown voltage can be established even at a high temperature.

Figure 8:
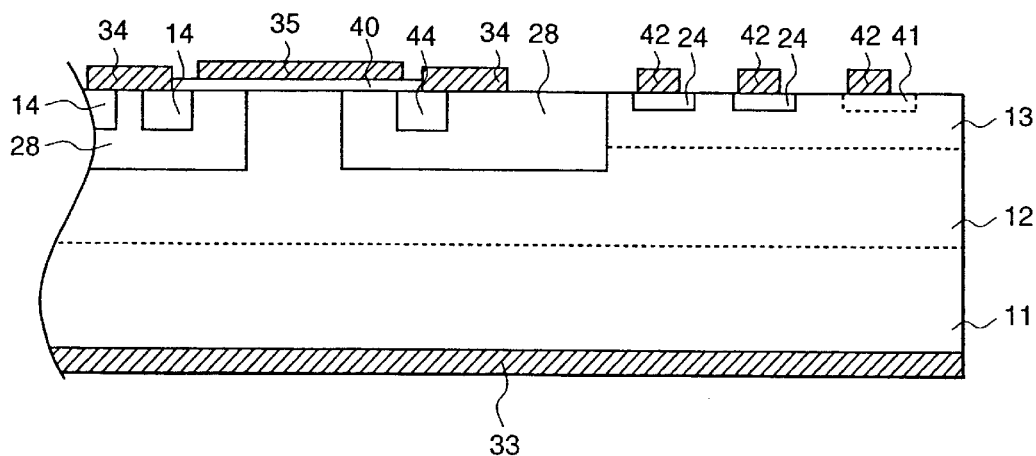
FIG. 8 is a sectional view of a structure of a planar type MOSFET of a seventh embodiment of the present invention.

FIG. 8 is a sectional view of a planar type MOSFET representing a seventh embodiment of the present invention. In the case of a planar type device, since a gate oxide film is formed in the surface, an n-type reverse layer, which is a channel, is formed in a surface portion of a p-type base region. The current flows from the channel into an n-type epitaxial layer through a portion near the interface with a oxide film of the drift layer. Therefore, in the case of a planar type MOSFET, since an n⁻ layer 13 appears under an oxide film 40, even if the thickness of the n⁻ layer 13 is prescribed, the on-characteristic will be influenced. In order to prevent this problem, in the present embodiment, the n⁻ layer 13 in which the impurity concentration is made less than ½ times the concentration of the n-type epitaxial layer is formed only in the termination region outside the p-type region 28. In a forming method, p-type impurities of low concentration are selectively implanted in the termination region by an ion implanting method so that the net n-type impurity concentration becomes ½ or less of the concentration of the n-type epitaxial layer. A lower limit of the net n-type impurity concentration is ⅟₁₀ because of controllability of ion implanting. When the implanted p-type impurity concentration is raised to more than ⅟₁₀, the termination surface is turned to p-type in some cases by variation in implantation. Further, the depth of the implanted p-type impurities is made shallower than the p-type region 28 as in the sixth embodiment. Thereby, in the same manner as the above embodiments, a high resistance region does not appear in the drift layer, a prescribed breakdown voltage can be achieved even at a high temperature without damaging the on-characteristic.

The structure of the present embodiment also can be used for other types of FET, and the same effect is brought about.

Figure 9:
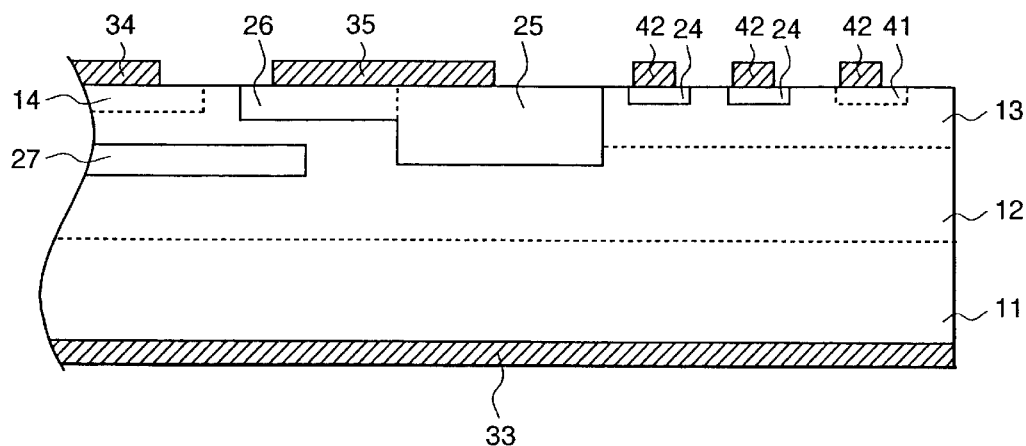
FIG. 9 is a sectional view of a structure of a buried type junction FET of an eighth embodiment of the present invention.

FIG. 9 is a rough sectional view of a depletion layer junction FET representing an eighth embodiment of the present invention. The present embodiment is a depletion layer junction FET in which the depletion layer junction FET of the fourth embodiment is modified by forming a low concentration n⁻ layer 13 only in the termination region and making it shallower than the combined guard ring and gate p⁺ region, as in the seventh embodiment. The concentration of the n⁻ layer 13 also is made ½ or less of that of the n-type epitaxial layer 12 as in the seventh embodiment. In the present embodiment, also, a prescribed breakdown voltage can be achieved even at a high temperature without damaging the on-characteristic.

Figure 10:
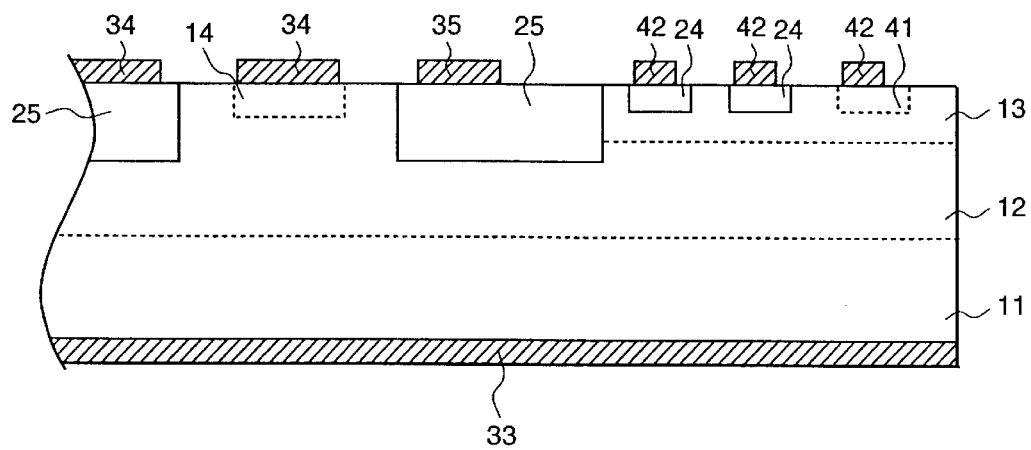
FIG. 10 is a sectional view of a structure of a planar type junction FET of a ninth embodiment of the present invention.

FIG. 10 is a sectional view of a planar type junction FET representing a ninth embodiment of the present invention. The present embodiment is a planar type junction FET in which the depletion layer junction FET of the fourth embodiment is modified by forming a low concentration n⁻ layer 13 only in the termination region and making it shallower than the combined guard ring and gate p⁺ region, as in the seventh embodiment. The concentration of the n⁻ layer 13 also is made ½ or less of that of the n-type epitaxial layer 12 as in the seventh embodiment. In the present embodiment, also, a prescribed breakdown voltage can be achieved even at a high temperature without damaging the on-characteristic.

Figure 11:
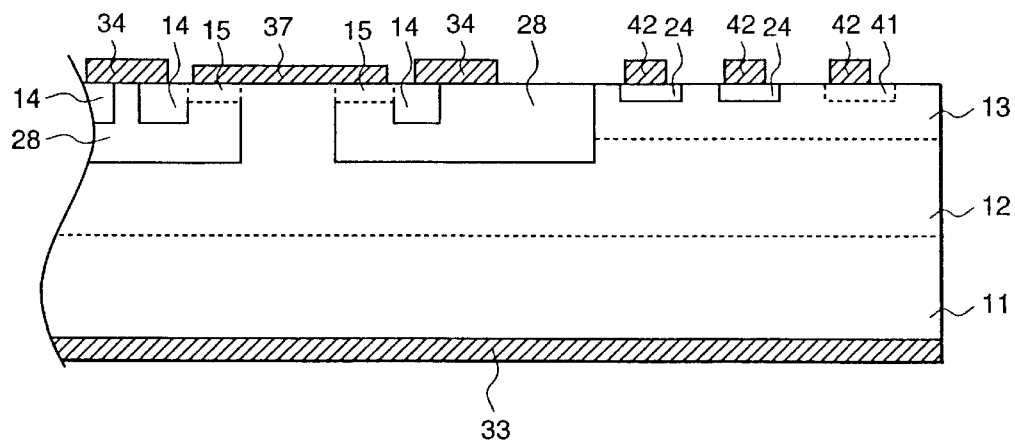
FIG. 11 is a sectional view of a structure of a MESFET of a tenth embodiment of the present invention.

FIG. 11 is a sectional view representing a MESFET of a tenth embodiment of the present invention. In FIG. 11, 15 denotes an n-type accumulation layer and 37 denotes a gate electrode forming an n-type semiconductor and Shottky junction. In the case of the present embodiment, the n-type accumulation layer 15 which is a channel is formed on a surface portion of a p-type region 28. The current from the channel flows into an n-type epitaxial layer 12 through a portion near the interface of the drift layer with the gate electrode 37, in the same manner as in the planar type MODFET of the seventh embodiment. Therefore, in the same manner as in the planar type MODFET, since an n⁻ layer 13 appears under the gate electrode 37, even if the thickness of the n⁻ layer 13 is prescribed, an influence on the on-resistance occurs. In order to prevent such a problem, in the present embodiment, the n⁻ layer 13 in which the impurity concentration is made less than ½ times the concentration of the n-type epitaxial layer is formed only in the termination region outside the p-type region 28 and is made shallower than the p-type region 28. Thereby, a high resistance region does not appear in the drift layer, and a prescribed breakdown voltage can be achieved even at a high temperature without damaging the on-characteristic.

The above fourth to tenth embodiments were explained with reference to the case of a n-type channel FET, however, the present invention is not limited to such a case, but also is applicable to the case of a p-type channel FET. Further, the present invention can be applied not only to a FET, but also to bipolar transistors, insulation gate transistors(IGBT), thyristors, etc. and the same effect can be brought about.

Figure 12:
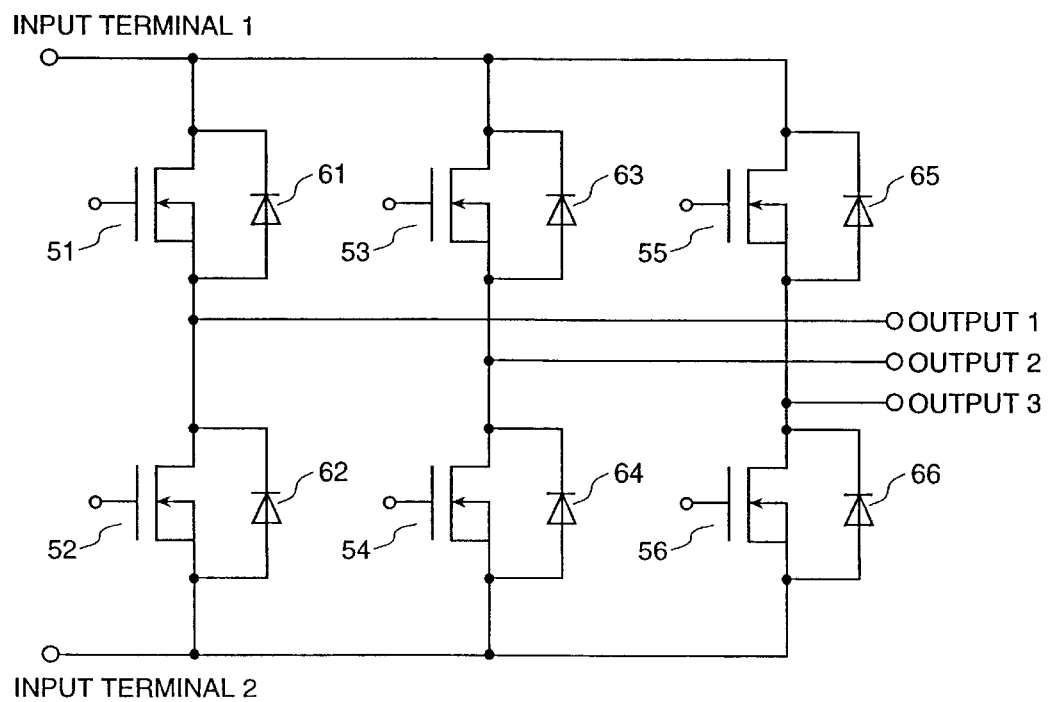
FIG. 12 is a schematic circuit diagram of a main circuit of an embodiment of an invertor apparatus in which diodes and FETs according to the present invention are used.

FIG. 12 is a circuit diagram of an invertor apparatus representing an example of a power convertor using a diode and FET according to an eleventh embodiment of the present invention. In FIG. 12, reference numerals 51, 52, 53, 54, 55, 56 and 56 each denote an FET according to the present invention and an example of a MODFET. Further, reference numerals 61, 62, 63, 64, 65 and 66 each denote a diode according to the present invention. The MOSFETs 51 and 52, 53 and 54, 55 and 56 are paired, respectively, inputs of current, voltage inputted into an input terminal 1 and an input terminal 2 are outputted as outputs 1 to 3 independently from each other by complementary switching of two the MOSFETs of each pair and each pair independently. Specifically, this forms a three phase invertor in which a dc voltage is inputted and a three phase ac is outputted. In this case, a load, such as a three phase inductor, is connected to the output terminals 1 to 3. Since the diode and transistor according to the present invention achieve a high breakdown voltage without affecting the on-characteristic even at a high temperature, even when a semiconductor device, in which the electron avalanche breakdown voltage is larger than Si, uses SiC, it is possible to reduce the loss caused by the semiconductor device and it is possible to simplify the cooling for the device because of high reliability even at a high temperature, by using the semiconductor device according to the present invention in the invertor. Thereby, it is possible to achieve a cost reduction and efficiency improvement in a system employing the invertor.

As mentioned above, while each embodiment is explained with reference to the case a SiC element, the present invention is not limited thereto, but is applicable to cases where other semiconductors in which the electron avalanche breakdown voltage is larger than Si are used. The present invention also is useful for wide gap semiconductors, such as those that use nitrogen gallium (GaN).

According to the present invention, since the maximum field intensity in the termination can be reduced, it is possible to secure a high reliability even in high temperature operation.

What is claimed is:

1. A semiconductor device having a pair of main surfaces and comprising:
   a substrate of a first conductivity type;
   a first layer, formed on a first main surface of said substrate, having a first conductivity type and being lower in resistance than said substrate;
   a first electrode formed on said first layer;
   a first region formed on a second main surface of said substrate and having a conductivity type different from said substrate;
   a second electrode formed on said first region; and
   a termination region surrounding a peripheral portion of said first region, wherein
   said semiconductor device comprises a second layer formed on said second main surface of said substrate and having the same conductivity type as said substrate and a higher resistance than said substrate,
   said termination region is formed on a surface of said second layer, and
   said substrate comprises one of SiC and GaN.

2. A semiconductor device having a pair of main surfaces and comprising:
   a substrate of a first conductivity type;
   a first layer, formed on a first main surface of said substrate, having a first conductivity type and being lower in resistance than said substrate;
   a first electrode formed on said first layer;
   a first region formed on a second main surface of said substrate and having a conductivity type different from said substrate;
   a second electrode being a control electrode formed on said first region,
   a second region of a first conductivity type having a high impurity concentration and being formed on a second main surface of said substrate;
   a third electrode formed in said second region; and
   a termination region surrounding a peripheral portion of said first region in which said third electrode is formed, wherein
   said semiconductor device comprises a second layer formed on said second main surface of said substrate and having the same conductivity type as said substrate and a higher resistance than said substrate,
   said termination region is formed on a surface of said second layer, and
   said substrate comprises one of SiC and GaN.

3. A semiconductor device according to claim 1 or 2, wherein a ratio of resistance between said substrate and the second layer is larger than 1:2.

4. A semiconductor device according to claim 1 or 2, wherein a ratio of impurity concentration between said substrate and the second layer is larger than 2:1.

5. A semiconductor device according to claim 1 or 2, wherein the thickness of said second layer is thinner than said first region.

6. A semiconductor device according to claim 1 or 2, wherein the thickness of said second layer is thinner than said second region.

7. A semiconductor device according to claim 1 or 2, wherein said second layer is formed in said termination region.

8. A power converter comprising a pair of DC terminals, a number of AC terminals corresponding to the number of phases, and semiconductor elements connected between said DC terminals and said AC terminals, wherein said semiconductor elements each are made of said semiconductor device according to claim 1.

9. A power converter comprising a pair of DC terminals, a number of AC terminals corresponding to the number of phases, and semiconductor elements connected between said DC terminals and said AC terminals, wherein said semiconductor elements each are made of said semiconductor device according to claim 2.

10. A semiconductor device having a pair of main surfaces and comprising:

a substrate of a first conductivity type;

a first layer, formed on a first main surface of said substrate, having a first conductivity type and being lower in resistance than said substrate;

a first electrode formed on said first layer; and a termination region surrounding a peripheral portion of said first region, wherein said semiconductor device comprises a second layer formed on a second main surface of said substrate and having the same conductivity type as said substrate and a higher resistance than said substrate, a first region formed on said second layer and having a conductivity type different from said substrate, and a second electrode formed on said first region, said termination region is formed on a surface of said second layer, and said substrate comprises one of SiC and GaN.

* * * * *